United States Patent
Kuroda et al.

(10) Patent No.: US 12,431,411 B2
(45) Date of Patent: Sep. 30, 2025

(54) SEMICONDUCTOR DEVICE AND SEMICONDUCTOR COMPONENT INCLUDING THE SAME

(71) Applicant: Panasonic Intellectual Property Management Co., Ltd., Osaka (JP)

(72) Inventors: Masayuki Kuroda, Osaka (JP); Takahiro Sato, Toyama (JP); Manabu Yanagihara, Osaka (JP); Hideyuki Okita, Osaka (JP); Masahiro Hikita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 347 days.

(21) Appl. No.: 18/248,990

(22) PCT Filed: Aug. 25, 2021

(86) PCT No.: PCT/JP2021/031086
§ 371 (c)(1),
(2) Date: Apr. 13, 2023

(87) PCT Pub. No.: WO2022/085297
PCT Pub. Date: Apr. 28, 2022

(65) Prior Publication Data
US 2023/0386978 A1    Nov. 30, 2023

(30) Foreign Application Priority Data
Oct. 20, 2020   (JP) .................. 2020-176219

(51) Int. Cl.
*H10D 30/47*     (2025.01)
*H01L 23/482*    (2006.01)
(Continued)

(52) U.S. Cl.
CPC ...... *H01L 23/4824* (2013.01); *H01L 23/4952* (2013.01); *H01L 23/49562* (2013.01);
(Continued)

(58) Field of Classification Search
None
See application file for complete search history.

(56) References Cited

U.S. PATENT DOCUMENTS

| | | |
|---|---|---|
| 9,564,524 B2 | 2/2017 | Curatola et al. |
| 2010/0140721 A1 | 6/2010 | Takagi |

(Continued)

FOREIGN PATENT DOCUMENTS

| | | |
|---|---|---|
| JP | 2010-161348 A | 7/2010 |
| JP | 2011-124365 A | 6/2011 |

(Continued)

OTHER PUBLICATIONS

International Search Report issued on Nov. 9, 2021 in International Patent Application No. PCT/JP2021/031086, with English translation.

*Primary Examiner* — Grant S Withers
(74) *Attorney, Agent, or Firm* — Rimon P.C.

(57) ABSTRACT

A semiconductor device includes: a substrate; a first nitride semiconductor layer on the substrate; a second nitride semiconductor layer on the first nitride semiconductor layer; finger-shaped source electrodes on the second nitride semiconductor layer; finger-shaped drain electrodes disposed so as to be spaced apart from the source electrodes; and finger-shaped gate electrodes respectively disposed between the source electrodes and the drain electrodes. The gate electrodes are electrically connected, via a first gate integrated wiring, a plurality of second gate integrated wirings and a third gate integrated wiring, to gate pads located on one or both ends of the third gate integrated wiring. A (Continued)

plurality of source pads and the plurality of second gate integrated wirings are formed alternately in a first direction perpendicular to the longitudinal direction of the gate electrodes.

14 Claims, 7 Drawing Sheets

(51) Int. Cl.
  *H01L 23/495* (2006.01)
  *H10D 62/85* (2025.01)
  *H10D 64/23* (2025.01)
  *H10D 89/60* (2025.01)
(52) U.S. Cl.
  CPC ....... *H10D 30/475* (2025.01); *H10D 62/8503* (2025.01); *H10D 64/257* (2025.01); *H10D 89/611* (2025.01)

(56) References Cited

U.S. PATENT DOCUMENTS

| | | | |
|---|---|---|---|
| 2015/0035066 A1* | 2/2015 | Otsuka | H10D 84/01 257/368 |
| 2016/0268380 A1 | 9/2016 | Furukawa et al. | |
| 2017/0222001 A1 | 8/2017 | Kawano | |

FOREIGN PATENT DOCUMENTS

| | | |
|---|---|---|
| JP | 2016-171265 A | 9/2016 |
| JP | 2017-139321 A | 8/2017 |

* cited by examiner

SEMICONDUCTOR DEVICE AND SEMICONDUCTOR COMPONENT INCLUDING THE SAME

CROSS-REFERENCE OF RELATED APPLICATIONS

This application is the U.S. National Phase under 35 U.S.C. § 371 of International Patent Application No. PCT/JP2021/031086, filed on Aug. 25, 2021, which in turn claims the benefit of Japanese Patent Application No. 2020-176219, filed on Oct. 20, 2020, the entire disclosures of which Applications are incorporated by reference herein.

TECHNICAL FIELD

The present disclosure relates to a semiconductor device which includes nitride semiconductor, such as gallium nitride (GaN), as a semiconductor material, and a semiconductor component which includes the semiconductor device.

BACKGROUND ART

In recent years, as a power transistor for switching, the commercialization of a field effect transistor (GaN-FET), which includes GaN that is nitride semiconductor, has been progressing. A general structure of the GaN-FET is that a GaN layer as a channel layer and AlGaN as a barrier layer are disposed on a semiconductor substrate, and two-dimensional electron gas generated by spontaneous polarization and piezo-electric polarization at the heterojunction interface of the channel layer and the barrier layer is used as a channel.

The GaN-FET has low loss, and is capable of performing high-speed switching operation compared to SiC and the like, and is expected to be miniaturized at the system level. In the GaN-FET having such a structure, channel current flows in the direction parallel to the substrate. As a result, source pads, drain pads, and gate pads, which supply voltage or current from an external power source through wires or the like to the FET, are disposed on the front surface side of the substrate. The source electrode, drain electrode, and gate electrode of the transistor in the active region are electrically connected to respective pads via the lead wires or collective wires. In order to improve the high-speed switching characteristics of the GaN, it is necessary to sufficiently reduce the resistance of the gate collective wire to increase the gate current supplied to the gate electrode.

CITATION LIST

Patent Literature

[PTL 1] U.S. Pat. No. 9,564,524

SUMMARY OF INVENTION

Technical Problem

However, in the conventional GaN-FET layout, a thin and narrow gate collective wire is drawn to the gate pad. Also, in Patent Literature (PTL) 1, the gate electrodes are bundled outside the active region via the gate lead wire, and further bypass the outer periphery of the active region and are connected to the gate electrode pad layer via the gate collective wire. As a result, as the number of unit transistors included in the power transistor is increased in order to increase the output, the wire length of the gate electrode of each unit transistor till reaching one or two gate pads that are generally included in the nitride semiconductor device increases, leading to a problem of an increase in the gate wire resistance. Accordingly, when the chip size and the length of the gate collective wire are increased in particular for high-power applications, the resistance of the gate collective wire is increased, leaving room for improvement in high-speed switching characteristics.

In view of the above problems, a main object of the present disclosure is to provide a semiconductor device suitable for high-speed switching operation and a semiconductor component including the semiconductor device. The semiconductor device includes gate collective wires and source wire pads which are arranged alternately, so that the resistance of the gate collective wires is reduced while reducing the chip size.

Other issues and novel features will become apparent from the description and accompanying drawings of the present disclosure.

Solution to Problem

In order to solve the problems, a semiconductor device according to one aspect of the present disclosure includes: a substrate; a first nitride semiconductor layer which is disposed on the substrate; a second nitride semiconductor layer which is disposed on the first nitride semiconductor layer; a source electrode which is disposed on the second nitride semiconductor layer, the source electrode being finger-shaped; a drain electrode which is disposed on the second nitride semiconductor layer apart from the source electrode, the drain electrode being finger-shaped; a gate electrode which is disposed between the source electrode and the drain electrode, the gate electrode being finger-shaped; a drain pad; a drain lead wire; a plurality of source pads; a source lead wire; a source collective wire which extends in a first direction that is perpendicular to a lengthwise direction of the gate electrode in a plan view of the substrate; a gate pad; a first gate collective wire which extends in the first direction; a plurality of second gate collective wires; and a third gate collective wire which extends in the first direction. The drain electrode is electrically connected to the drain pad via the drain lead wire, the source electrode is electrically connected to the plurality of source pads via the source lead wire and the source collective wire, the gate electrode is electrically connected to the gate pad, which is positioned at one end or each of ends of the third gate collective wire, via the first gate collective wire, the plurality of second gate collective wires, and the third gate collective wire, and the plurality of source pads and the plurality of second gate collective wires are alternately disposed in the first direction.

A semiconductor component according to one aspect of the present disclosure includes: the semiconductor device described above; and a lead frame. The lead frame includes: a die pad portion to which the semiconductor device is fixed; a source terminal; a gate terminal; and a drain terminal, and each of the plurality of source pads and the source terminal are electrically connected via a bonding wire, the gate pad and the gate terminal are electrically connected via a bonding wire, and the drain pad and the drain terminal are electrically connected via a bonding wire.

Advantageous Effects of Invention

With the present disclosure, it is possible to reduce the resistance of the gate collective wire while reducing the chip size.

DESCRIPTION OF EMBODIMENTS

Hereinafter, embodiments will be described in detail with reference to the drawings. It should be noted that the embodiments described below show general or specific examples. Numerical values, shapes, materials, structural elements, arrangement positions and connection forms of the structural elements, and the like illustrated in the following embodiments are examples, and are not intended to limit the present disclosure. Moreover, the embodiments in the present disclosure are not limited to the current independent claims, but may be expressed by other independent claims.

Embodiment 1

Figure 1A:
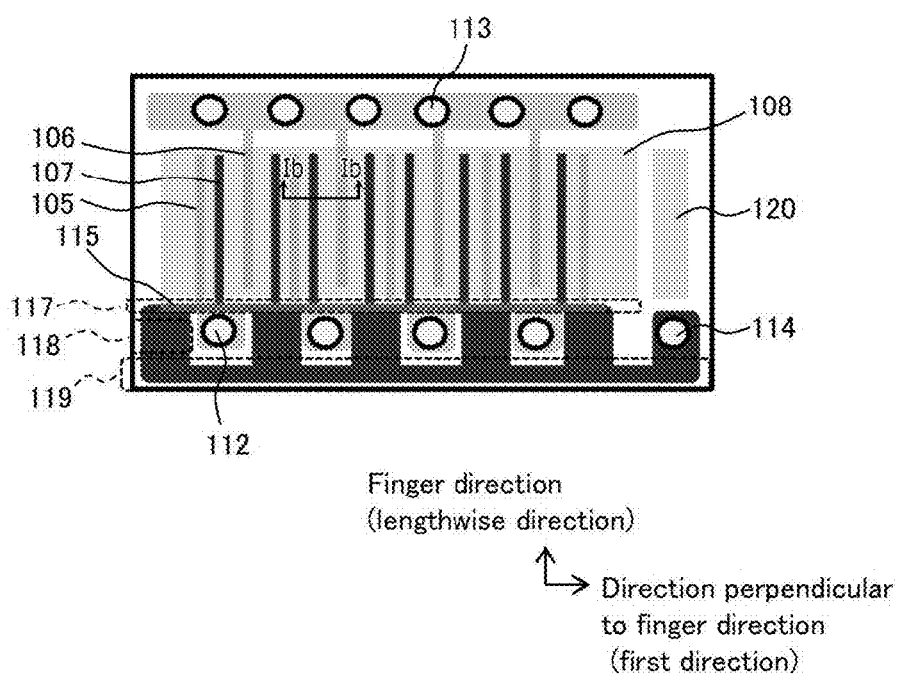
FIG. 1A is a plan view of a semiconductor device according to Embodiment 1.
Figure 1B:
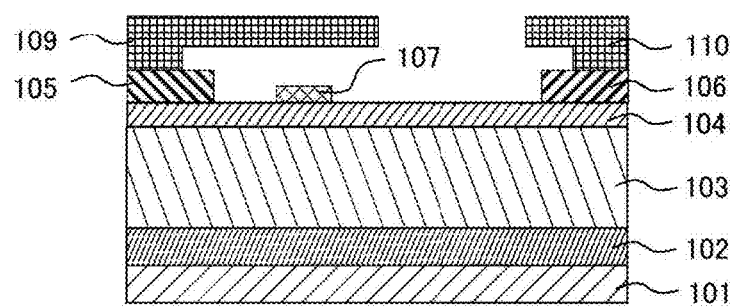
FIG. 1B is a cross-sectional view of the semiconductor device according to Embodiment 1.

FIG. 1A is a plan view of a nitride semiconductor device according to Embodiment 1. FIG. 1B is a cross-sectional view taken along line Ib-Ib in FIG. 1A.

The semiconductor device in FIG. 1A and FIG. 1B includes substrate 101, buffer layer 102, first nitride semiconductor layer 103, second nitride semiconductor layer 104, source electrodes 105, drain electrodes 106, gate electrodes 107, active region 108, source lead wires 109, drain lead wires 110, source pads 112, drain pads 113, gate pad 114, source collective wire 115, first gate collective wire 117, second gate collective wires 118, and third gate collective wire 119.

As illustrated in FIG. 1B, buffer layer 102 (for example, a single layer or a plurality of layers of GaN, AlGaN, AlN, InGaN, AlInGaN or the like which is group III nitride semiconductor) is disposed on substrate 101 (for example, a substrate of Si, Sapphire, SiC, GaN, AlN or the like). First nitride semiconductor layer 103 made of GaN (or, for example, InGaN, AlGaN, AlInGaN, or the like, which is Group III nitride semiconductor) is disposed on buffer layer 102. Second nitride semiconductor layer 104 made of AlGaN (or, for example, GaN, InGaN, AlGaN, AlN, AlIn-GaN or the like, which is Group III nitride semiconductor) is disposed on first nitride semiconductor layer 103. Second nitride semiconductor layer 104 includes a bandgap larger than the bandgap of first nitride semiconductor layer 103. When second nitride semiconductor layer 104 is made of AlGaN and first nitride semiconductor layer 103 is made of GaN, a high-concentration two-dimensional electron gas (2DEG) layer is formed on the GaN layer side in the vicinity of the AlGaN/GaN interface due to the effects of piezoelectric polarization and spontaneous polarization cause by the lattice constant difference between AlGaN and GaN. The region where the two-dimensional electron gas is formed is active region 108 in FIG. 1A. Source electrode 105 and drain electrode 106 are disposed apart from each other on second nitride semiconductor layer 104. Source electrode 105 and drain electrode 106 each are made of an electrode including one metal or a combination of two or more metals, such as Ti, Al, Mo, and Hf that are in ohmic contact with any one of the two-dimensional electron gas layer, second nitride semiconductor layer 104, and first nitride semiconductor layer 103. Source electrode 105 and drain electrode 106 are, for example, electrically connected to the two-dimensional electron gas layer in active region 108. For example, source electrode 105 and drain electrode 106 may be disposed on a surface of second nitride semiconductor layer 104, or may be in contact with portions of the two-dimensional electron gas layer, second nitride semiconductor layer 104, and first nitride semiconductor layer 103. Gate electrode 107 is disposed on second nitride semiconductor layer 104, between source electrode 105 and drain electrode 106. Gate electrode 107 may be an electrode including one metal or a combination of two or more metals such as Ti, Ni, Pd, Pt, Au, W, WSi, Ta, TiN, Al, Mo, Hf, and Zr.

A p-type nitride semiconductor layer including p-type impurities (such as Mg, Zn, and C) may be disposed between second nitride semiconductor layer 104 and at least one of source electrode 105, drain electrode 106, or gate electrode 107. At least one of source electrode 105, drain electrode 106 or gate electrode 107 may be in direct contact with the p-type nitride semiconductor layer and second nitride semiconductor layer 104. Source lead wire 109 and drain lead wire 110 made of, for example, Au or Al are respectively disposed on source electrode 105 and drain electrode 106.

As illustrated in FIG. 1A, in a plan view, finger-shaped source electrode 105 and finger-shaped drain electrode 106 are disposed apart from each other on the second nitride semiconductor layer. Finger-shaped gate electrode 107 is disposed between source electrode 105 and drain electrode 106. Drain electrode 106 is connected to drain pad 113 via drain lead wire 110. Source electrode 105 is electrically connected to a plurality of source pads 112 via source lead wire 109 and source collective wire 115 that extends in a direction perpendicular to the finger direction. Here, the finger direction means the length-wise direction of the finger-shaped gate electrode. Hereinafter, the direction perpendicular to the finger direction may be referred to as a first direction.

Gate electrode 107 is electrically connected to gate pad 114 which is positioned at one end or each of ends of third gate collective wire 119 via first gate collective wire 117 that extends in a first direction that is perpendicular to the finger direction, a plurality of second gate collective wires 118, and third gate collective wire 119 that extends in the first direction. Source pads 112 and second gate collective wires 118 are alternately disposed in the first direction. The width of each second gate collective wire 118 in the first direction may be preferably 50 μm to 1000 μm. Gate electrode 107, first gate collective wire 117, second gate collective wires 118, and third gate collective wire 119 may be simultaneously formed of the same metal configuration. Moreover, electrostatic discharge (ESD) protection element 120 including a transistor-type diode is disposed in the vicinity of gate pad 114 in order to prevent ESD destruction. ESD protection element 120 includes an anode that is electrically connected to source collective wire 115, and a cathode that is electrically connected to gate pad 114 (not illustrated).

Here, source lead wire 109 and drain lead wire 110 have a function of drawing current and/or voltage from finger-shaped source electrode 105 and finger-shaped drain electrode 106 in active region 108, respectively. First to third gate collective wires 117, 118, 119 and source collective wire 115 have a function of collecting the current and/or voltage drawn from gate electrode 107 and source lead wire 109, respectively. Source pads 112, drain pads 113, and gate pad 114 are electrically connected to the electric contacts on the leads of the lead frame via bonding wires.

With the above configuration, compared to the case as in PTL 1 where gate current is supplied from the gate pad to the gate electrode in the active region via a single narrow and thin gate collective wire that extends in the first direction, it is possible to supply larger gate current. This is because the gate current can be supplied via second gate collective wires 118 and wide third gate collective wire 119 that extends in the first direction, and the electric resistance from gate pad 114 to gate electrode 107 is reduced. In general, the turn-on switching speed (dV/dt, dI/dt) of a transistor increases as gate current increases. Accordingly, the present disclosure allows a high-speed switching operation and miniaturization at the system level. In addition, since the inductance of the entire gate collective wire is also reduced, parasitic oscillation due to the formation of a positive feedback circuit can be reduced. It is also possible to improve the parameter margin of an RC circuit including a parallel circuit of R and C (speed-up capacitor) at the gate input portion, and to increase the degree of freedom in designing the drive circuit and layout. In addition, since the gate current can be increased, it is possible to apply large pulsed current less than or equal to a few hundred µs to the gate in the product inspection process. This allows a screening test for removing defects caused by crystal defects in the vicinity of gate electrode 107 to be performed, leading to an increase in product quality. Moreover, by reducing the resistance of the gate collective wire, it is possible to prevent the occurrence of so-called electromigration phenomenon in which metal atoms are moved by application of current to the collective wire, leading to an increase in product life.

Next, Variation 1 of Embodiment 1 will be described.

Figure 2:
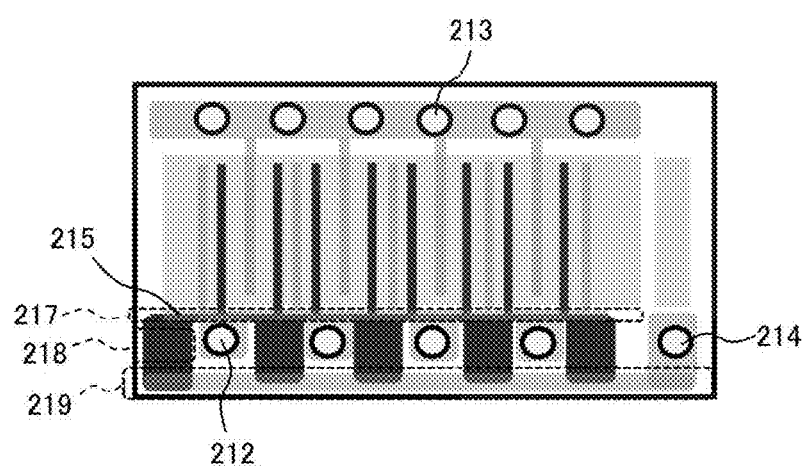
FIG. 2 is a plan view of a semiconductor device according to Variation 1 of Embodiment 1.

FIG. 2 is a plan view of a semiconductor device according to Variation 1 of Embodiment 1. As illustrated in FIG. 2, the material thickness of each of third gate collective wire 219 and gate pad 214 is greater than the material thickness of each of first and second gate collective wires 217 and 218. For example, each of third gate collective wire 219 and gate pad 214 may be made of the same metal as the metal of source collective wire 215, and may be made of, for example, Au or Cu. Third gate collective wire 219 and gate pad 214 are electrically connected to second gate collective wires 218. With this, it is possible to further reduce the resistance of the gate collective wires while reducing the chip size.

Next, Variation 2 of Embodiment 1 will be described.

Figure 3:
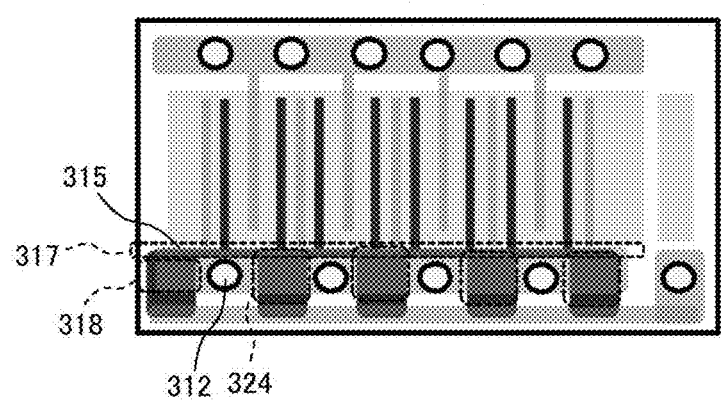
FIG. 3 is a plan view of a semiconductor device according to Variation 2 of Embodiment 1.

FIG. 3 is a plan view of a semiconductor device according to Variation 2 of Embodiment 1. As illustrated in FIG. 3, source pads 312 can be electrically connected via a plurality of source pad connectors 324. Source pad connectors 324 can be formed on second gate collective wires 318 via an interlayer film such as SiO2 or SiN, and be made of the same material as the materials of source pad 312 and source collective wire 315. Source pad connectors 324 are electrically isolated from second gate collective wires 318. Since a capacitance is formed in the overlapping portion between second gate collective wire 318 and the source pad connector via the interlayer film, the gate-source capacitance (Cgs) increases. Generally, when Cgs/Cgd ratio that is the ratio of the gate-drain capacitance Cgd of a FET to the gate-source capacitance Cgs is decreased due to the temporal change dv/dt in voltage at the time of switching, voltage is generated at the gate, causing self-turn-on phenomenon. This malfunction may lead to destruction. With the configuration according to the present disclosure, it is possible to increase the Cgs/Cgd ratio while reducing the resistance of the entire gate collective wire, preventing self-turn-on.

Next, Variation 3 of Embodiment 1 will be described.

Figure 4:
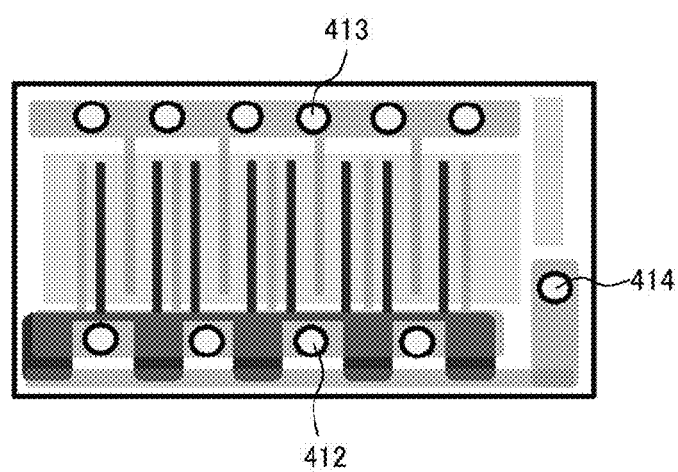
FIG. 4 is a plan view of a semiconductor device according to Variation 3 of Embodiment 1.

FIG. 4 is a plan view of a semiconductor device according to Variation 3 of Embodiment 1. As illustrated in FIG. 4, gate pad 414 can be disposed at a position shifted in the finger direction relative to source pads 412. As a result, it is possible to increase the degree of freedom in package design of the gate wire on the semiconductor chip side while reducing the resistance of the gate collective wires. In addition, by disposing the source pad 412 region apart from gate pad 414, wire bonding can be performed with a high yield rate.

Moreover, in the present embodiment, each source pad 412 is connected to the source terminal of the lead frame via a bonding wire, and source pad 412, drain pad 413, and gate pad 414 are substantially equal to each other in height. If the pad heights are different, the pressing load generated when the bonding tool descends varies, and the impact load on the bonding pads causes damages to the bonding pads, the interlayer film under the bonding pads, and the nitride semiconductor layer. Hence, the pressing force of the bonding load and the like needs to be adjusted. However, by setting the pads to have a substantially equal height as in the present embodiment, such adjustment of the pressing force of the bonding load becomes unnecessary.

Next, a specific example of the gate collective wires will be described.

Figure 5:
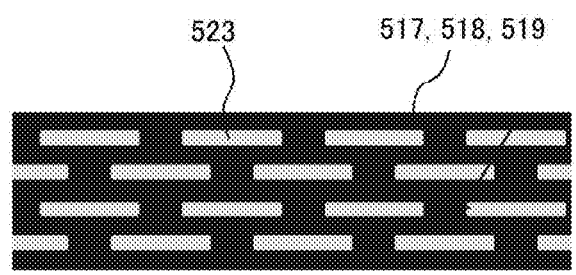
FIG. 5 is an enlarged view of gate collective wires in the semiconductor device according to Embodiment 1.

FIG. 5 is an enlarged view of the gate collective wires of the semiconductor device according to Embodiment 1. As illustrated in FIG. 5, first, second, and third gate collective wires 517, 518, 519 include a plurality of slits 523. In the finger direction, each slit may have a width of 0.1 µm to 3.0 µm, and the interval between adjacent ones of the slits may be 1 µm to 10 µm. In the direction perpendicular to the finger direction, each slit may have a width of 3 µm to 40 µm, and the interval between adjacent ones of the slits may be 1.0 µm to 10 µm. By adopting such a slit configuration, it is possible to disperse stress to the collective wire while reducing the resistance of the gate collective wire. For example, it is possible to alleviate the plastic deformation of the collective wire metal caused when thermal stress is applied. In addition, it is possible to prevent compression stress applied from the PKG resin, and to prevent the generation of cracks caused by a plurality of stress concentration points being proximally generated at the end of the collective wired and combined. The slits may be configured in a grid, staggered, or any other shape.

As described above, the semiconductor device according to Embodiment 1 includes: a substrate; a first nitride semiconductor layer which is disposed on the substrate; a second nitride semiconductor layer which is disposed on the first nitride semiconductor layer; a source electrode which is disposed on the second nitride semiconductor layer, the source electrode being finger-shaped; a drain electrode which is disposed on the second nitride semiconductor layer apart from the source electrode, the drain electrode being finger-shaped; a gate electrode which is disposed between the source electrode and the drain electrode, the gate electrode being finger-shaped; a drain pad; a drain lead wire; a plurality of source pads; a source lead wire; a source collective wire which extends in a first direction that is perpendicular to a lengthwise direction of the gate electrode in a plan view of the substrate; a gate pad; a first gate collective wire which extends in the first direction; a plurality of second gate collective wires; and a third gate collective wire which extends in the first direction. The drain electrode is electrically connected to the drain pad via the drain lead wire, the source electrode is electrically connected to the plurality of source pads via the source lead wire and the source collective wire, the gate electrode is electrically connected to the gate pad, which is positioned at one end or each of ends of the third gate collective wire, via the first gate collective wire, the plurality of second gate collective wires, and the third gate collective wire, and the plurality of source pads and the plurality of second gate collective wires are alternately disposed in the first direction.

With this, the gate wire resistance can be reduced, that is, the resistance components of the first to third gate collective wires can be reduced, facilitating high-speed switching operation. In addition, the chip size as a semiconductor device can be reduced.

For example, the gate electrode, the first gate collective wire, the second gate collective wires, and the third gate collective wire may have a same metal configuration.

With this, the gate wire resistance can be further reduced.

For example, each of the third gate collective wire and the gate pad may have a material thickness greater than a material thickness of each of the first gate collective wire and the plurality of second gate collective wires.

With this, the gate wire resistance can be further reduced.

For example, it may be that the semiconductor device further includes a source pad connector, and adjacent ones of the plurality of source pads are electrically connected via the source pad connector.

With this, the Cgs/Cgd ratio (that is, the ratio of the gate-drain capacitance Cgd to the gate-source capacitance Cgs) can be improved while reducing the resistance of the entire gate wire, and self-turn-on can be reduced.

For example, it may be that the gate pad is disposed at a position shifted in the lengthwise direction relative to an arrangement direction of the plurality of source pads.

With this, the degree of freedom in arranging the gate wire can be increased.

For example, it may be that each of the plurality of source pads is a pad for bonding a bonding wire.

With this, since the source collective wire and the source pad are not connected by vias, the manufacturing process can be simplified.

For example, it may be that the plurality of source pads, the drain pad, and the gate pad are substantially equal to each other in height relative to the substrate.

With this, damage due to wire bonding can be reduced.

For example, it may be that the gate collective wire includes a plurality of slits.

With this, it is possible to reduce the occurrence of cracks.

For example, it may be that in the plan view of the semiconductor device, in the lengthwise direction, each of the plurality of slits has a width of 0.1 µm to 3.0 µm, and an interval between adjacent ones of the plurality of slits is 1 µm to 10 µm, and in the first direction, each of the plurality of slits has a width of 3 µm to 40 µm, and an interval between adjacent ones of the plurality of slits is 1.0 µm to 10 µm.

With this, it is possible to reduce the occurrence of cracks.

Embodiment 2

Figure 6A:
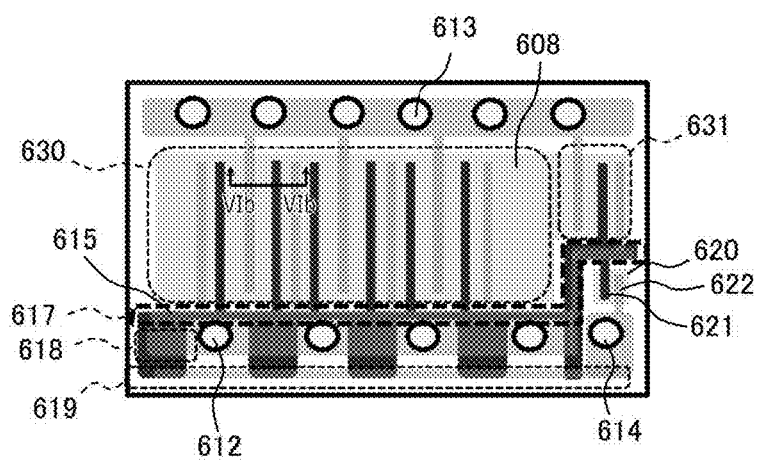
FIG. 6A is a plan view of a semiconductor device according to Embodiment 2.
Figure 6B:
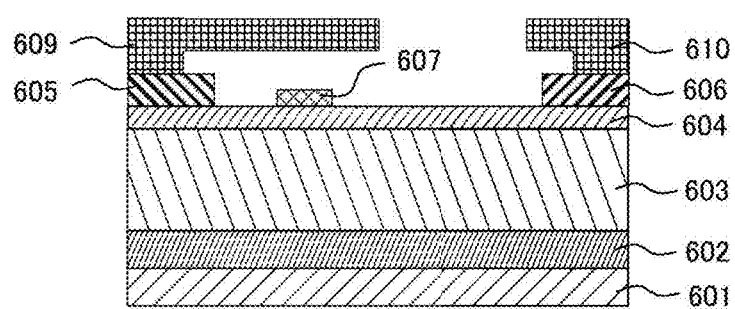
FIG. 6B is a cross-sectional view of the semiconductor device according to Embodiment 2.

FIG. 6A is a plan view of a nitride semiconductor device according to Embodiment 2. FIG. 6B is a cross-sectional view taken along line VIb-VIb in FIG. 6A.

As illustrated in FIG. 6B, buffer layer 602 (for example, a single layer or a plurality of layers of GaN, AlGaN, AlN, InGaN, AlInGaN or the like which is group III nitride semiconductor) is disposed on substrate 601 (for example, a substrate of Si, Sapphire, SiC, GaN, AlN or the like). First nitride semiconductor layer 603 made of GaN (or, for example, InGaN, AlGaN, AlInGaN, or the like, which is Group III nitride semiconductor) is disposed on buffer layer 602. Second nitride semiconductor layer 604 made of AlGaN (or for example, GaN, InGaN, AlGaN, AlN, AlInGaN or the like, which is Group III nitride semiconductor) is disposed on first nitride semiconductor layer 603. Second nitride semiconductor layer 604 includes a bandgap larger than the bandgap of first nitride semiconductor layer 603. When second nitride semiconductor layer 604 is made of AlGaN and first nitride semiconductor layer 603 is made of GaN, a high-concentration two-dimensional electron gas (2DEG) layer (not illustrated) is formed on the GaN layer side in the vicinity of the AlGaN/GaN interface due to the effects of piezo-electric polarization and spontaneous polarization caused by the lattice constant difference between AlGaN and GaN. The region where the two-dimensional electron gas is formed is active region 608 in FIG. 6A. Active region 608 includes a long finger portion in which the finger length of the transistor is long and a short finger portion in which the finger length of the transistor is short. Source electrode 605 and drain electrode 606 are disposed apart from each other on second nitride semiconductor layer 604. Source electrode 605 and drain electrode 606 each are made of an electrode including one metal or a combination of two or more metals, such as Ti, Al, Mo, and Hf that are in ohmic contact with any one of the two-dimensional electron gas layer, second nitride semiconductor layer 604 and first nitride semiconductor layer 603. Source electrode 605 and drain electrode 606 may be electrically connected to the two-dimensional electron gas layer in active region 608. For example, source electrode 605 and drain electrode 606 may be disposed on a surface of second nitride semiconductor layer 604, or may be in contact with portions of the two-dimensional electron gas layer, second nitride semiconductor layer 604, and first nitride semiconductor layer 603 using a known ohmic recess technique (not illustrated). Gate electrode 607 is disposed on second nitride semiconductor layer 604, between source electrode 605 and drain electrode 606. Gate electrode 607 may be an electrode including one metal or a combination of two or more metals, such as Ti, Ni, Pd, Pt, Au, W, WSi, Ta, TiN, Al, Mo, Hf, and Zr.

A p-type nitride semiconductor layer including p-type impurities (Mg, Zn, C, etc.) may be disposed between second nitride semiconductor layer 604 and at least one of source electrode 605, drain electrode 606, or gate electrode 607. At least one of source electrode 605, drain electrode 606 or gate electrode 607 may be in direct contact with the p-type nitride semiconductor layer and second nitride semiconductor layer 604 (not illustrated). Source lead wire 609 and drain lead wire 610 made of, for example, Au or Al are respectively disposed on source electrode 605 and drain electrode 606.

As illustrated in FIG. 6A, in a plan view, on the second nitride semiconductor layer, finger-shaped source electrodes 605 and finger-shaped drain electrodes 606 each having a long finger length are disposed apart from each other in the long finger portion, and finger-shaped source electrode 605 and finger-shaped drain electrode 606 each having a short finger length are disposed apart from each other in the short finger portion. In the long finger portion, finger-shaped gate electrode 607 having a long finger length is disposed between source electrode 605 and drain electrode 606. In the short finger portion, finger-shaped gate electrode 607 having a short finger length is disposed between source electrode 605 and drain electrode 606. Drain electrode 606 is connected to drain pad 613 via drain lead wire 610. Source electrode 605 is electrically connected to source pads 612 via source lead wire 609 and the source collective wire that extends in the first direction. The source collective wire is electrically connected to source electrodes 605 in both the long finger portion and the short finger portion. At the boundary between the long finger portion and the short finger portion, the source collective wire extends so as to surround the outer periphery of active region 608 in the long finger portion.

Gate electrode 607 is electrically connected to gate pad 614, which is positioned at one end or each of ends of third gate collective wire 619, via first gate collective wire 617 that extends in the first direction, a plurality of second gate collective wires 618, and third gate collective wire 619 that extends in the first direction. Source pads 612 and second gate collective wires 618 are alternately disposed in the first direction. In a similar manner to the source collective wire, first gate collective wire 617 is electrically connected to gate electrodes 607 in both the long finger portion and the short finger portion. At the boundary between the long finger portion and the short finger portion, first gate collective wire 617 extends so as to surround the outer periphery of active region 608 in the long finger portion. The width of each second gate collective wire 618 in the first direction can be preferably 50 μm to 1000 μm. Gate electrode 607, first gate collective wire 617, second gate collective wires 618, and third gate collective wire 619 may be simultaneously formed of the same metal configuration. ESD protection element 620 including a transistor-type diode is disposed in the vicinity of gate pad 614 in order to prevent ESD destruction. The source collective wire, ESD protection element 620, and gate pad 614 are arranged in this order in the direction opposite to the finger direction from the short finger portion. ESD protection element 620 includes anode 621 that is electrically connected to the source collective wire, and cathode 622 that is electrically connected to gate pad 614.

Here, source lead wire 609 and drain lead wire 610 have a function of drawing current and/or voltage from finger-shaped source electrode 605 and finger-shaped drain electrode 606 in active region 608, respectively. First to third gate collective wires 617, 618, 619 and source collective wire 615 have a function of collecting the current and/or voltage drawn from gate electrode 607 and source lead wire 609, respectively. Source pads 612, drain pads 613, and gate pad 614 are electrically connected to the electric contacts on the leads of the lead frame via bonding wires.

With the above configuration, compared to the case as in PTL 1 where gate current is supplied from the gate pad to the gate electrode in the active region via a single narrow and thin gate collective wire that extends in the first direction, it is possible to supply larger gate current. This is because the gate current can be supplied via second gate collective wires 618 and wide third gate collective wire 619 that extends in the first direction, and the electric resistance from gate pad 614 to gate electrode 607 is reduced. Moreover, by dividing active region 608 into a long finger portion and a short finger portion and reducing the area of the inactive region, the chip size can be further reduced while further reducing the resistance of the gate collective wire. Since the configuration examples of the gate collective wires are the same as those in Embodiment 1, the description thereof will be omitted.

As described above, the semiconductor device according to Embodiment 2 includes: a substrate; a first nitride semiconductor layer which is disposed on the substrate; a second nitride semiconductor layer which is disposed on the first nitride semiconductor layer; a source electrode which is disposed on the second nitride semiconductor layer, the source electrode being finger-shaped; a drain electrode which is disposed on the second nitride semiconductor layer apart from the source electrode, the drain electrode being finger-shaped; a gate electrode which is disposed between the source electrode and the drain electrode, the gate electrode being finger-shaped; a drain pad; a drain lead wire; a plurality of source pads; a source lead wire; a source collective wire which extends in a first direction that is perpendicular to a lengthwise direction of the gate electrode in a plan view of the substrate; a gate pad; a first gate collective wire which extends in the first direction; a plurality of second gate collective wires; a third gate collective wire which extends in the first direction; an active region; and an electrostatic discharge (ESD) protection element. The drain electrode is electrically connected to the drain pad via the drain lead wire, the source electrode is electrically connected to the plurality of source pads via the source lead wire and the source collective wire, the gate electrode is electrically connected to the gate pad, which is positioned at one end or each of ends of the third gate collective wire, via the first gate collective wire, the plurality of second gate collective wires, and the third gate collective wire, the plurality of source pads and the plurality of second gate collective wires are alternately disposed in the first direction, the active region includes a long finger portion and a short finger portion, the source collective wire, the ESD protection element, and the gate pad are arranged in this order in the lengthwise direction from the short finger portion, the ESD protection element includes an anode that is electrically connected to the source collective wire, and the ESD protection element includes a cathode that is electrically connected to the gate pad.

With this, the gate wire resistance can be reduced, facilitating high-speed switching operation. In addition, the size of the source collective wire which supplies power to the ESD protection element can be reduced, leading to a reduction in chip size.

Embodiment 3

Figure 7A:
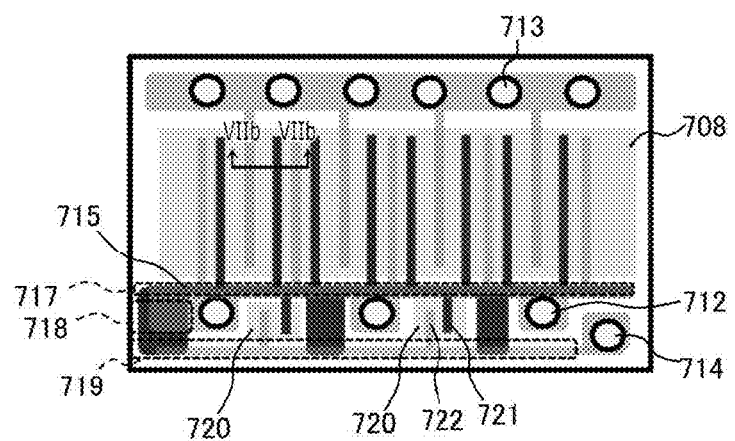
FIG. 7A is a plan view of a semiconductor device according to Embodiment 3.
Figure 7B:
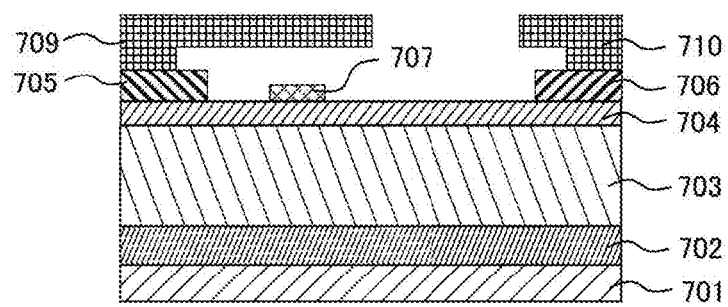
FIG. 7B is a cross-sectional view of the semiconductor device according to Embodiment 3.

FIG. 7A is a plan view of a nitride semiconductor device according to Embodiment 3. FIG. 7B is a cross-sectional view of FIG. 7A.

As illustrated in FIG. 7B, buffer layer 702 (for example, a single layer or a plurality of layers of GaN, AlGaN, AlN, InGaN, AlInGaN or the like which is group III nitride semiconductor) is disposed on substrate 701 (for example, a substrate of Si, Sapphire, SiC, GaN, AlN or the like). First nitride semiconductor layer 703 made of GaN (or, for example, InGaN, AlGaN, AlInGaN, or the like, which is Group III nitride semiconductor) is disposed on buffer layer 702. Second nitride semiconductor layer 704 made of AlGaN (or, for example, GaN, InGaN, AlGaN, AlN, AlInGaN or the like, which is Group III nitride semiconductor) is disposed on first nitride semiconductor layer 703. Second nitride semiconductor layer 704 includes a bandgap larger than the bandgap of first nitride semiconductor layer 703. When second nitride semiconductor layer 704 is made of AlGaN and first nitride semiconductor layer 703 is made of GaN, a high-concentration two-dimensional electron gas (2DEG) layer (not illustrated) is formed on the GaN layer side in the vicinity of the AlGaN/GaN interface due to the effects of piezo-electric polarization and spontaneous polarization cause by the lattice constant difference between AlGaN and GaN. The region where the two-dimensional electron gas layer is formed is active region 708 in FIG. 7A. Source electrode 705 and drain electrode 706 are disposed apart from each other on second nitride semiconductor layer 704. Source electrode 705 and drain electrode 706 each may be made of an electrode including one metal or a combination of two or more metals, such as Ti, Al, Mo, and Hf that are in ohmic contact with any one of the two-dimensional electron gas layer, second nitride semiconductor layer 704 and first nitride semiconductor layer 703. Source electrode 705 and drain electrode 706 may be electrically connected to the two-dimensional electron gas layer in active region 708. For example, source electrode 705 and drain electrode 706 may be disposed on a surface of second nitride semiconductor layer 704, or may be in contact with portions of the two-dimensional electron gas layer, second nitride semiconductor layer 704, and first nitride semiconductor layer 703 using a known ohmic recess technique (not illustrated). Gate electrode 707 is disposed on second nitride semiconductor layer 704, between source electrode 705 and drain electrode 706. Gate electrode 707 may be an electrode including one metal or a combination of two or more metals, such as Ti, Ni, Pd, Pt, Au, W, WSi, Ta, TiN, Al Mo, Hf, and Zr.

A p-type nitride semiconductor layer including p-type impurities (Mg, Zn, C, etc.) may be disposed between second nitride semiconductor layer 704 and at least one of source electrode 705, drain electrode 706, or gate electrode 707. At least one of source electrode 705, drain electrode 706 or gate electrode 707 may be in direct contact with the p-type nitride semiconductor layer and second nitride semiconductor layer 704 (not illustrated). Source lead wire 709 and drain lead wire 710 each made of, for example, Au or Al are respectively disposed on source electrode 705 and drain electrode 706.

As illustrated in FIG. 7A, in a plan view, finger-shaped source electrode 705 and finger-shaped drain electrode 706 are disposed apart from each other on the second nitride semiconductor layer. Finger-shaped gate electrode 707 is disposed between source electrode 705 and drain electrode 706. Drain electrode 706 is connected to drain pad 713 via drain lead wire 710. Source electrode 705 is electrically connected to a plurality of source pads 712 via source lead wire 709 and source collective wire 715 that extends in the first direction.

Gate electrode 707 is electrically connected to gate pad 714, which is positioned at one end or each of ends of third gate collective wire 719, via first gate collective wire 717 that extends in the first direction, a plurality of second gate collective wires 718, and third gate collective wire 719 that extends in the first direction. Source pads 712 and second gate collective wires 718 are alternately disposed in the first direction. The width of each second gate collective wire 718 in the first direction may be preferably 50 μm to 7000 μm.

Gate electrode 707, first gate collective wire 717, second gate collective wires 718, and third gate collective wire 719 may be simultaneously formed of the same metal configuration. Moreover, between one second gate collective wire 718 and one source pad 712, each ESD protection element 720 including a transistor-type diode is disposed in order to prevent ESD destruction. ESD protection element 720 includes anode 721 that is electrically connected to the source collective wire and cathode 722 that is electrically connected to the gate collective wire. In FIG. 7A, cathode 722 is electrically connected to third gate collective wire 719, but may be electrically connected to at least one of first, second, or third gate collective wires 717, 718, or 719.

Here, source lead wire 709 and drain lead wire 710 have a function of drawing current and/or voltage from finger-shaped source electrode 705 and finger-shaped drain electrode 706 in active region 708, respectively. First to third gate collective wires 717, 718, 719 and source collective wire 715 have a function of collecting the current and/or voltage drawn from gate electrode 707 and source lead wire 709, respectively. Source pads 712, drain pads 713, and gate pad 714 are electrically connected to the electric contacts on the leads of the lead frame via bonding wires.

With the above configuration, compared to the case as in PTL 1 where gate current is supplied from the gate pad to the gate electrode in the active region via a single narrow and thin gate collective wire that extends in the first direction, it is possible to supply larger gate current. This is because the gate current can be supplied via second gate collective wires 718 and wide third gate collective wire 719 that extends in the first direction, and the electric resistance from gate pad 714 to gate electrode 707 is reduced. Moreover, each ESD protection element 720 is disposed between one second gate collective wire 718 and one source pad 712, so that the area of the inactive region can be reduced, and the chip size can be further reduced while further reducing the resistance of the gate collective wires. Since the configuration examples of the gate collective wires are the same as those in Embodiment 1, the description thereof will be omitted.

As described above, the semiconductor device according to Embodiment 3 includes: a substrate; a first nitride semiconductor layer which is disposed on the substrate; a second nitride semiconductor layer which is disposed on the first nitride semiconductor layer; a source electrode which is disposed on the second nitride semiconductor layer, the source electrode being finger-shaped; a drain electrode which is disposed on the second nitride semiconductor layer apart from the source electrode, the drain electrode being finger-shaped; a gate electrode which is disposed between the source electrode and the drain electrode, the gate electrode being finger-shaped; a drain pad; a drain lead wire; a plurality of source pads; a source lead wire; a source collective wire which extends in a first direction that is perpendicular to a lengthwise direction of the gate electrode in a plan view of the substrate; a gate pad; a first gate collective wire which extends in the first direction; a plurality of second gate collective wires; a third gate collective wire which extends in the first direction; an active region; and an electrostatic discharge (ESD) protection element. The drain electrode is electrically connected to the drain pad via the drain lead wire, the source electrode is electrically connected to the plurality of source pads via the source lead wire and the source collective wire, the gate electrode is electrically connected to the gate pad, which is positioned at one end or each of ends of the third gate collective wire, via the first gate collective wire, the plurality of second gate collective wires, and the third gate collective wire, the plurality of source pads and the gate collective wire are alternately disposed in the first direction, and each of a plurality of the ESD protection elements is disposed between a second gate collective wire among the plurality of second gate collective wires and a source pad among the plurality of source pads.

With this, the gate wire resistance can be reduced, facilitating high-speed switching operation. In addition, the size of the source collective wire which supplies power to the ESD protection element can be reduced, leading to a reduction in chip size.

Embodiment 4

Figure 8A:
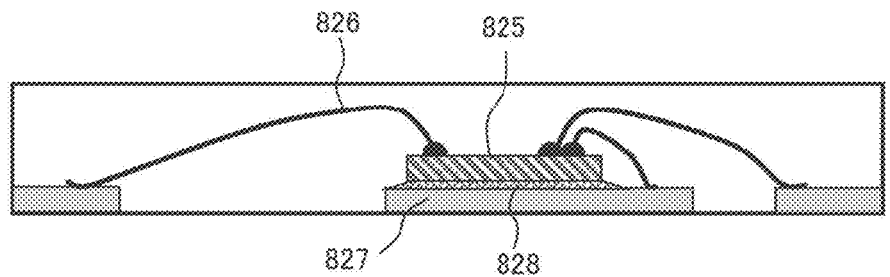
FIG. 8A is a cross-sectional view of a semiconductor component according to Embodiment 4.
Figure 8B:
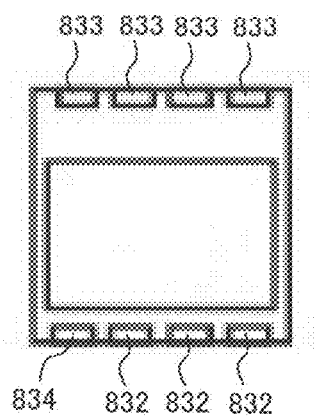
FIG. 8B is a bottom view of the semiconductor component according to Embodiment 4.

FIG. 8A is a cross-sectional view of a semiconductor component according to Embodiment 4. FIG. 8B is a bottom view of the semiconductor component. Semiconductor chip 825 according to Embodiment 1 to Embodiment 3 is fixed to the die pad portion (where a chip is mounted) of lead frame 827. Source pad 812 and source terminal 832 of lead frame 827 are electrically connected via bonding wire 826. Gate pad 814 and gate terminal 834 of lead frame 827 are electrically connected via bonding wire 826. Drain pad 813 and drain terminal 833 of lead frame 827 are electrically connected via bonding wire 826.

The semiconductor component is formed by individualizing semiconductor chip 825 according to Embodiment 1 to Embodiment 3 through a back surface polishing step and a dicing step, fixing individualized semiconductor chip 825 on the die pad of lead frame 827 using an electrically conductive paste-like adhesive, bonding wires to the semiconductor pad and lead, and encapsulating it with an epoxy resin molding material.

Die attachment material 828 may be an electrically conductive paste-like adhesive such as a solder paste or a silver paste, or may be a non-electrically conductive paste-like adhesive including a resin-based material such as epoxy or polyimide. The metal material of bonding wire 826 may be any one of Au, Cu, Al alloy, pure Al, and others, or a combination thereof. The bonding method may be any one of ball bonding, wedge bonding, and others or a combination thereof. The form of the bonding member may be any one of a thin wire, a thick wire, a ribbon, a clip, and others, or a combination thereof. In the figures, the form of the surface mount device (SMD) package is illustrated, but through hole device (THD) package may be used. Moreover, it may be that there are a plurality of source terminals and a single gate terminal, and the single gate terminal is arranged next to the plurality of source terminals which are successively arranged.

With such a configuration, it is possible to provide a semiconductor component in which the resistance of the gate collective wire is reduced while reducing the chip size.

As described above, the semiconductor component according to Embodiment 4 includes: the semiconductor device described above; and a lead frame. The lead frame includes: a die pad portion to which the semiconductor device is fixed; a source terminal; a gate terminal; and a drain terminal, and each of the plurality of source pads and the source terminal are electrically connected via a bonding wire, the gate pad and the gate terminal are electrically connected via a bonding wire, and the drain pad and the drain terminal are electrically connected via a bonding wire.

With this, the gate wire resistance can be reduced, facilitating high-speed switching operation. In addition, the chip size can be reduced, leading to a reduction in size of the semiconductor component.

For example, it may be that the semiconductor component is any one of a surface mount device (SMD) and a through-hole device (THD). It may be that there are a plurality of source terminals and a single gate terminal, and the single gate terminal is arranged next to the plurality of source terminals which are successively arranged. The semiconductor component is any one of a surface mount device (SMD) and a through-hole device (THD).

With this, the size of the semiconductor component can be reduced.

Embodiment 5

Figure 9:
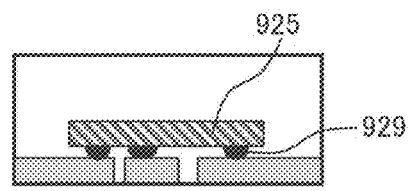
FIG. 9 is a cross-sectional view of a semiconductor component according to Embodiment 5.

FIG. 9 is a cross-sectional view of a semiconductor component according to Embodiment 5. Semiconductor chip 925 according to Embodiment 1 to Embodiment 3 is bonded to the die pad portion. Source pad 912 and the source terminal of lead frame 927 are electrically connected via bump 929, gate pad 914 and the gate terminal of lead frame 927 are electrically connected via bump 929, and drain pad 913 and the drain terminal of lead frame 927 are electrically connected via bump 929.

With such a flip-chip configuration, since the wiring space for wires is not required, the size of the package can be reduced. In addition, loss due to power supply noise and wire inductance and resistance can be reduced. The material of each bump 929 may be any one of Ni, Cu, SnAg, Au, Al, and others, or a combination thereof. Moreover, it may be that there are a plurality of source terminals and a single gate terminal, and the single gate terminal is arranged next to the plurality of source terminals which are successively arranged.

With such a configuration (it is possible to provide a semiconductor component in which the resistance of the gate collective wire is reduced while reducing the chip size.

As described above, the semiconductor component according to Embodiment 5 includes: the semiconductor device described above; and a lead frame which includes a source terminal, a gate terminal, and a drain terminal. Each of the plurality of source pads and the source terminal are electrically connected via a bump, the gate pad and the gate terminal are electrically connected via a bump, and the drain pad and the drain terminal are electrically connected via a bump.

With this, the gate wire resistance can be reduced, facilitating high-speed switching operation. In addition, the chip size can be reduced, leading to a reduction in size of the semiconductor component.

Although the semiconductor device and the semiconductor component according to one or more embodiments have been described above based on the embodiments, the present disclosure is not limited to such embodiments. Various modifications of the embodiments as well as embodiments resulting from arbitrary combinations of the structural elements of the embodiments that may be conceived by those skilled in the art are intended to be included within the scope of one or more aspects as long as these do not depart from the essence of the present disclosure.

INDUSTRIAL APPLICABILITY

The semiconductor device according to the present disclosure is usable as a switching transistor that operates at a high frequency of 1 MHz or more. The semiconductor device is particularly usable as a GaN power transistor.

The invention claimed is:

1. A semiconductor device comprising:
a substrate;
a first nitride semiconductor layer which is disposed on the substrate;
a second nitride semiconductor layer which is disposed on the first nitride semiconductor layer;
a source electrode which is disposed on the second nitride semiconductor layer, the source electrode being finger-shaped;
a drain electrode which is disposed on the second nitride semiconductor layer apart from the source electrode, the drain electrode being finger-shaped;
a gate electrode which is disposed between the source electrode and the drain electrode, the gate electrode being finger-shaped;
a drain pad;
a drain lead wire;
a plurality of source pads;
a source lead wire;
a source collective wire which extends in a first direction that is perpendicular to a lengthwise direction of the gate electrode in a plan view of the substrate;
a gate pad;
a first gate collective wire which extends in the first direction;
a plurality of second gate collective wires; and
a third gate collective wire which extends in the first direction,
wherein the drain electrode is electrically connected to the drain pad via the drain lead wire,
the source electrode is electrically connected to the plurality of source pads via the source lead wire and the source collective wire,
the gate electrode is electrically connected to the gate pad, which is positioned at one end or each of ends of the third gate collective wire, via the first gate collective wire, the plurality of second gate collective wires, and the third gate collective wire, and
the plurality of source pads and the plurality of second gate collective wires are alternately disposed in the first direction.

2. The semiconductor device according to claim 1,
wherein the gate electrode, the first gate collective wire, the plurality of second gate collective wires, and the third gate collective wire have a same metal configuration.

3. The semiconductor device according to claim 1,
wherein each of the third gate collective wire and the gate pad has a material thickness greater than a material thickness of each of the first gate collective wire and the plurality of second gate collective wires.

4. The semiconductor device according to claim 1, further comprising:
a source pad connector,
wherein adjacent ones of the plurality of source pads are electrically connected via the source pad connector.

5. The semiconductor device according to claim 1,
wherein the gate pad is disposed at a position shifted in the lengthwise direction relative to an arrangement direction of the plurality of source pads.

6. The semiconductor device according to claim 1,
wherein each of the plurality of source pads is a pad for bonding a bonding wire.

7. The semiconductor device according to claim 1,
wherein the plurality of source pads, the drain pad, and the gate pad are substantially equal to each other in height relative to the substrate.

8. The semiconductor device according to claim 1,
wherein at least one of the first gate collective wire, the plurality of second gate collective wires, or the third gate collective wire includes a plurality of slits.

9. The semiconductor device according to claim 8,
wherein, in the plan view of the semiconductor device,
in the lengthwise direction, each of the plurality of slits has a width of 0.1 μm to 3.0 μm, and an interval between adjacent ones of the plurality of slits is 1 μm to 10 μm, and
in the first direction, each of the plurality of slits has a width of 3 μm to 40 μm, and an interval between adjacent ones of the plurality of slits is 1.0 μm to 10 μm.

10. A semiconductor component comprising:
the semiconductor device according to claim 1; and
a lead frame,
wherein the lead frame includes: a die pad portion to which the semiconductor device is fixed; a source terminal; a gate terminal; and a drain terminal, and
each of the plurality of source pads and the source terminal are electrically connected via a bonding wire, the gate pad and the gate terminal are electrically connected via a bonding wire, and the drain pad and the drain terminal are electrically connected via a bonding wire.

11. The semiconductor component according to claim 10,
wherein the semiconductor component is one of a surface mount device (SMD) and a through-hole device (THD),
the source terminal comprises a plurality of source terminals, and the gate terminal comprises a single gate terminal, and
the single gate terminal is arranged next to the plurality of source terminals which are successively arranged.

12. A semiconductor component comprising:
the semiconductor device according to claim 1; and
a lead frame which includes a source terminal, a gate terminal, and a drain terminal,
wherein each of the plurality of source pads and the source terminal are electrically connected via a bump, the gate pad and the gate terminal are electrically connected via a bump, and the drain pad and the drain terminal are electrically connected via a bump.

13. A semiconductor device comprising:
a substrate;
a first nitride semiconductor layer which is disposed on the substrate;
a second nitride semiconductor layer which is disposed on the first nitride semiconductor layer;
a source electrode which is disposed on the second nitride semiconductor layer, the source electrode being finger-shaped;
a drain electrode which is disposed on the second nitride semiconductor layer apart from the source electrode, the drain electrode being finger-shaped;
a gate electrode which is disposed between the source electrode and the drain electrode, the gate electrode being finger-shaped;
a drain pad;
a drain lead wire;
a plurality of source pads;
a source lead wire;

a source collective wire which extends in a first direction that is perpendicular to a lengthwise direction of the gate electrode in a plan view of the substrate;
a gate pad;
a first gate collective wire which extends in the first direction;
a plurality of second gate collective wires;
a third gate collective wire which extends in the first direction;
an active region; and
an electrostatic discharge (ESD) protection element,
wherein the drain electrode is electrically connected to the drain pad via the drain lead wire,
the source electrode is electrically connected to the plurality of source pads via the source lead wire and the source collective wire,
the gate electrode is electrically connected to the gate pad, which is positioned at one end or each of ends of the third gate collective wire, via the first gate collective wire, the plurality of second gate collective wires, and the third gate collective wire,
the plurality of source pads and the plurality of second gate collective wires are alternately disposed in the first direction,
the active region includes a long finger portion and a short finger portion,
the source collective wire, the ESD protection element, and the gate pad are arranged in this order in the lengthwise direction from the short finger portion,
the ESD protection element includes an anode that is electrically connected to the source collective wire, and
the ESD protection element includes a cathode that is electrically connected to the gate pad.

14. A semiconductor device comprising:
a substrate;
a first nitride semiconductor layer which is disposed on the substrate;
a second nitride semiconductor layer which is disposed on the first nitride semiconductor layer;
a source electrode which is disposed on the second nitride semiconductor layer, the source electrode being finger-shaped;
a drain electrode which is disposed on the second nitride semiconductor layer apart from the source electrode, the drain electrode being finger-shaped;
a gate electrode which is disposed between the source electrode and the drain electrode, the gate electrode being finger-shaped;
a drain pad;
a drain lead wire;
a plurality of source pads;
a source lead wire;
a source collective wire which extends in a first direction that is perpendicular to a lengthwise direction of the gate electrode in a plan view of the substrate;
a gate pad;
a first gate collective wire which extends in the first direction;
a plurality of second gate collective wires;
a third gate collective wire which extends in the first direction;
an active region; and
an electrostatic discharge (ESD) protection element,
wherein the drain electrode is electrically connected to the drain pad via the drain lead wire,
the source electrode is electrically connected to the plurality of source pads via the source lead wire and the source collective wire,
the gate electrode is electrically connected to the gate pad, which is positioned at one end or each of ends of the third gate collective wire, via the first gate collective wire, the plurality of second gate collective wires, and the third gate collective wire,
the plurality of source pads and the plurality of second gate collective wires are alternately disposed in the first direction, and
each of a plurality of the ESD protection elements is disposed between a second gate collective wire among the plurality of second gate collective wires and a source pad among the plurality of source pads.

* * * * *